United States Patent
Savary et al.

(10) Patent No.: US 7,576,972 B2
(45) Date of Patent: Aug. 18, 2009

(54) SEALED ELECTRO-TECHNICAL DEVICE COMPRISING TWO SEALING JOINTS AND METHODS THEREFOR

(75) Inventors: Etienne Savary, Farvagny (CH); Cédric Scheidegger, Villeneuve (CH); Albert Galley, Praroman-Le Mouret (CH)

(73) Assignee: Maxwell Technologies, Inc., San Diego, CA (US)

( * ) Notice: Subject to any disclaimer, the term of this patent is extended or adjusted under 35 U.S.C. 154(b) by 236 days.

(21) Appl. No.: 11/547,455

(22) PCT Filed: Nov. 28, 2003

(86) PCT No.: PCT/CH03/00786

§ 371 (c)(1),
(2), (4) Date: Oct. 4, 2006

(87) PCT Pub. No.: WO2005/052965

PCT Pub. Date: Jun. 9, 2005

(65) Prior Publication Data

US 2007/0159774 A1    Jul. 12, 2007

(51) Int. Cl.
| | |
|---|---|
| H01G 9/10 | (2006.01) |
| H05K 5/03 | (2006.01) |
| B65D 51/00 | (2006.01) |
| H01G 2/10 | (2006.01) |
| H01G 4/38 | (2006.01) |
| H01M 2/00 | (2006.01) |

(52) U.S. Cl. .................. 361/519; 361/517; 361/518; 361/328; 429/163; 429/174; 429/171

(58) Field of Classification Search ................. 361/518, 361/519, 521, 517, 535, 536, 537, 328; 429/163, 429/170, 174, 171
See application file for complete search history.

(56) References Cited

U.S. PATENT DOCUMENTS 3,515,951 A  *  6/1970  Howell et al. ................ 361/518
(Continued)

FOREIGN PATENT DOCUMENTS

GB            2115084 A         9/1983
(Continued)

*Primary Examiner*—Eric Thomas
*Assistant Examiner*—David M Sinclair
(74) *Attorney, Agent, or Firm*—Oppedahl Patent Law Firm LLC (57) ABSTRACT

A method is described for applying a double sealing system to an electro-technical device and an electro-technical device with a double seal. Said Electro-technical device has; a container (5) housing a functional unit (2) and including one aperture (52) provided with a cover (6), wherein said cover has a first face (61) abutting an annular surface (520) which borders said aperture (52); a first sealing joint (7) accommodated in a first groove (64) provided in the first face (61) of the annular surface (520), a second groove (65) provided on said first face (61) of the annular surface (520), and surrounding the first groove (64), said second groove (65) having a closed concavity not directly accessible from the exterior of the electro-technical device (1) when the cover is applied to the annular surface (520). Said device further has a first channel (651) for connecting the second groove (65) to a first external point of injection (9) and a second sealing joint (8), made by injection molding of a sealing substance (81) after the cover has been applied to said annular surface, provided in the second groove (65).

6 Claims, 4 Drawing Sheets

U.S. PATENT DOCUMENTS

| | | | |
|---|---|---|---|
| 3,685,682 A * | 8/1972 | Frey, III | 220/359.1 |
| 4,769,745 A * | 9/1988 | Viernickel et al. | 361/518 |
| 5,560,511 A | 10/1996 | McNerney | |
| 5,798,906 A * | 8/1998 | Ando et al. | 361/520 |
| 5,942,728 A | 8/1999 | Chen | |
| 5,963,419 A * | 10/1999 | Tanaka et al. | 361/512 |
| 6,212,058 B1 * | 4/2001 | Huber | 361/301.5 |
| 2001/0040037 A1 | 11/2001 | Negishi | |

FOREIGN PATENT DOCUMENTS

WO   WO0028558 A1   5/2000

* cited by examiner

SEALED ELECTRO-TECHNICAL DEVICE COMPRISING TWO SEALING JOINTS AND METHODS THEREFOR

BACKGROUND

Designated by the term "securing" is at least one of the operations consisting of checking the tightness of the joint concerned and of protecting this joint from alteration.

The invention concerns more specifically, but not in a limiting way, the field of electro-technical devices comprising a plurality of capacitors fixed on a common support and a container in which said capacitors are housed.

The container is, for example, formed by an elongated tubular wall of electrically insulating material, and comprises at least one aperture, referred to as an access, of sufficient section to allow the insertion or even extraction of capacitors mounted on their common support.

In general, the container has a longitudinal axis and two opposite ends at the level of each of which an end face extends situated in a plane substantially orthogonal to said longitudinal axis. At least one of the end faces is formed by an annular surface which borders on a hole forming an opening for access to the inside of the container.

Conventionally, each end of the container having an access aperture bears a cover which is firmly held pressing tightly against the annular surface by means of restraining elements such as screws.

In a known way, the cover comprises a surface of contact on the annular surface, and the tightness between the surfaces in contact is ensured through interposition of a first sealing joint, in particular of toric type, between the annular surface and an annular supporting area provided in the surface of contact of the cover.

Known, to reinforce the tightness, is to form a second sealing joint around the cover in such a way as to occlude the interstice which appears at the periphery of the cover and container assembly, between the annular surface of the container and the surface of contact of the cover.

For this purpose, it is known for the cover and the container to have depressions which, when said cover and the container are brought together, form an open peripheral groove into which a sealing material, such as a silicon paste, can be poured.

This technique yields very good results, but it entails operations of manipulation of the electro-technical device to pour the supplementary joint, which can be detrimental to the container. In fact, in industrial circles, such electro-technical devices have conventionally a longitudinal dimension greater than a meter and a weight which can reach several hundred kilograms. When the container is made of ceramic, which is very often the case, this container is then sensitive to shocks, and a large number of manipulations thus increases significantly the risk of breakage.

A result which the present invention aims to obtain is to reduce the risk of breakage of electro-technical devices of the aforementioned type during formation of a second sealing joint.

Another drawback of state-of-the-art electro-technical devices ties in the fact that the supplementary joint is exposed to the atmosphere and can be altered by atmospheric agents. When the second sealing joint is altered, protection of the first sealing joint is no longer ensured.

Another result which the invention aims to obtain is a method for checking the impermeability of the sealing joint and protecting this first sealing joint from alteration in an ensured way.

SUMMARY OF THE INVENTION

The method of the invention applied to the double sealing system on the electro-technical device can reduce the rate of the failure during assembly at least by factor of 2. The second seal in the HV capacitor drastically improves the life-time of the capacitor especially for long-life-use (more than 20 years) which is frequent and improves the reliability in case of high pollution level environments or extreme climatic conditions (Temperature below −20° C. and higher 60° C.).

To this end, the invention has as its subject matter a method for securing a first sealing joint used on an electro-technical device, this electro-technical device comprising a functional unit and a container housing said functional unit, said container including at least one aperture provided with a cover which cover has at least one first face intended to abut an annular surface which borders on the aperture, and this through the agency of a first sealing joint accommodated in a first annular concave supporting area provided in at least one of the elements which are the container and the cover, is forcefully pushed in the direction of the annular surface, by means restraining elements, this electro-technical device comprising a second sealing joint inserted between the annular surface which borders on the aperture and the first face of the cover:

this method being characterised in that to insert the second sealing joint between the first annular surface which borders on the aperture and the first face of the cover:

during a first operation, in at least one of the elements which are the container and the cover, a second annular concave supporting area is formed, which second annular concave supporting area surrounds the first annular concave supporting area by extending a first predetermined distance from said first annular concave supporting area, has a closed concavity, i.e. is not directly accessible from the outside of the electro-technical device, during a second operation, after having applied the cover against the annular surface which borders on the aperture, the second sealing joint is formed by moulding a sealing substance in the second annular concave supporting area in such a way that this sealing substance presses at one and the same time against the cover and against the container.

The invention also has as its subject matter the electro-technical devices comprising a joint secured according to the method of the invention.

DESCRIPTION OF THE DRAWING

The invention will be better understood from reading the following description, given by way of non-limiting example, with reference to the attached schematic drawing.

DETAILED DESCRIPTION

Figure 1:
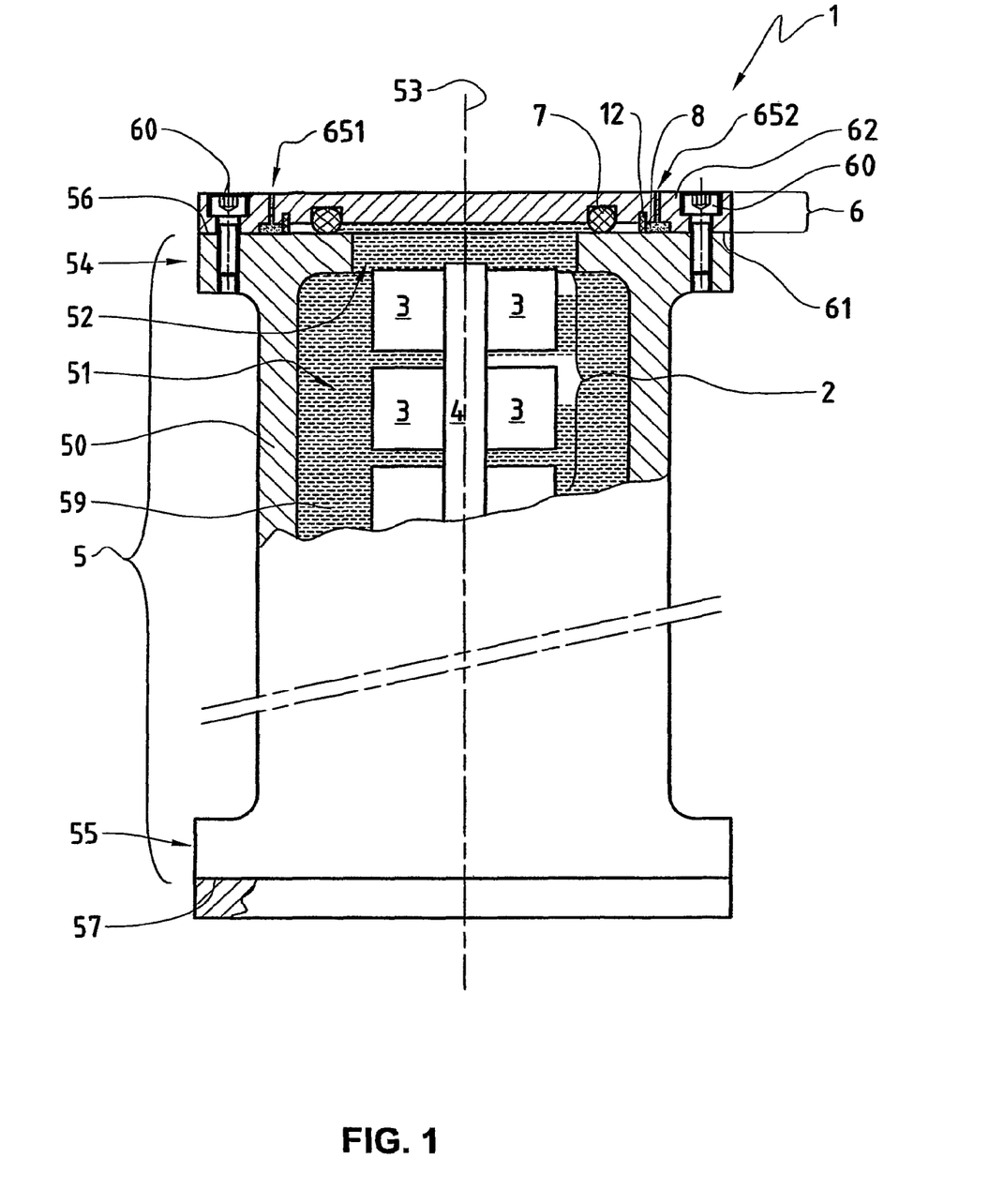
FIG. 1 shows a lateral view, partially in section, of an electro-technical device including a cover provided with a joint checked and secured according to the method of the invention.
Figure 2:
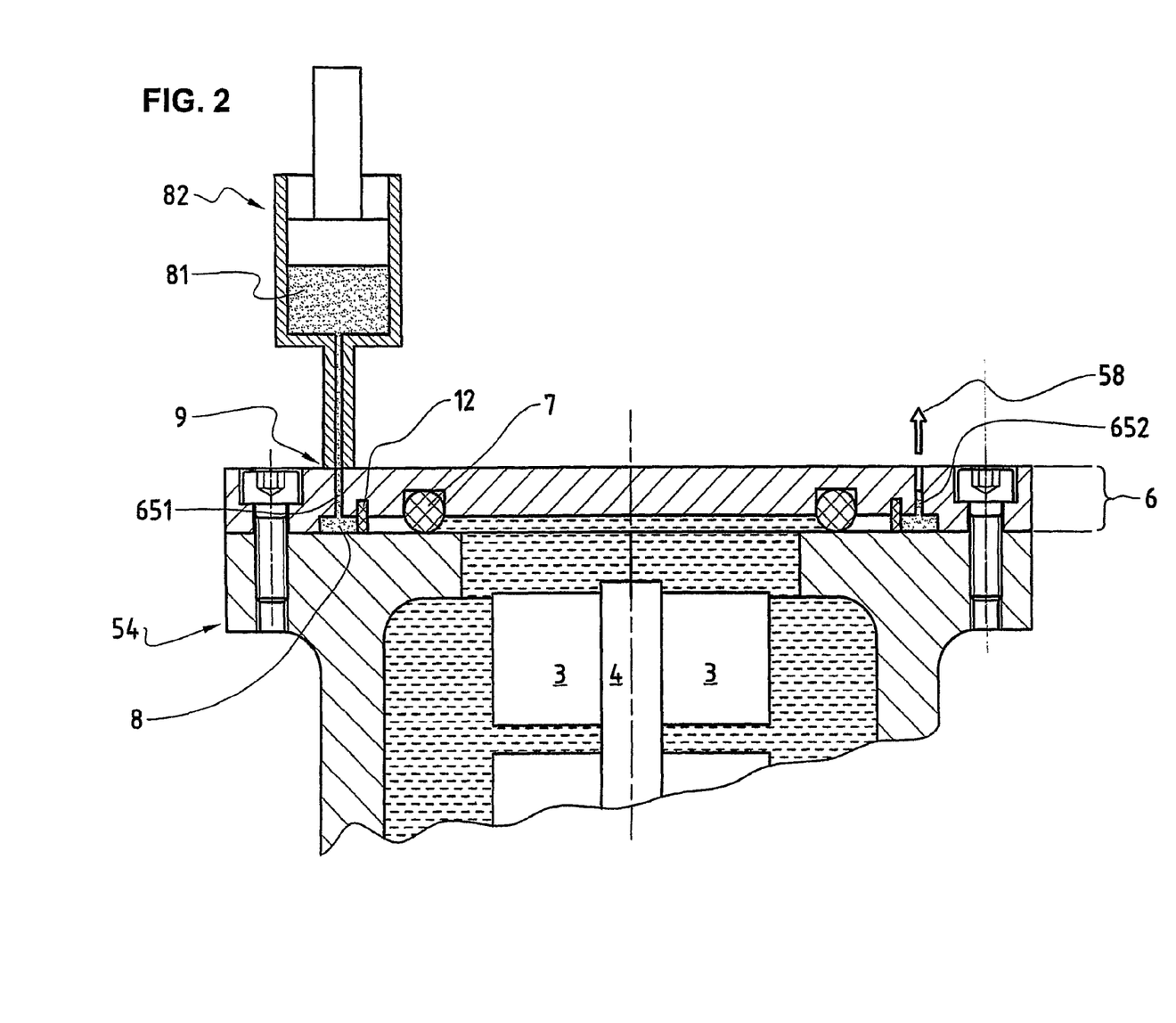
FIG. 2 shows a view partially in section, of an electro-technical device including a cover provided with a joint in the course of being secured according to the method of the invention.
Figure 3:
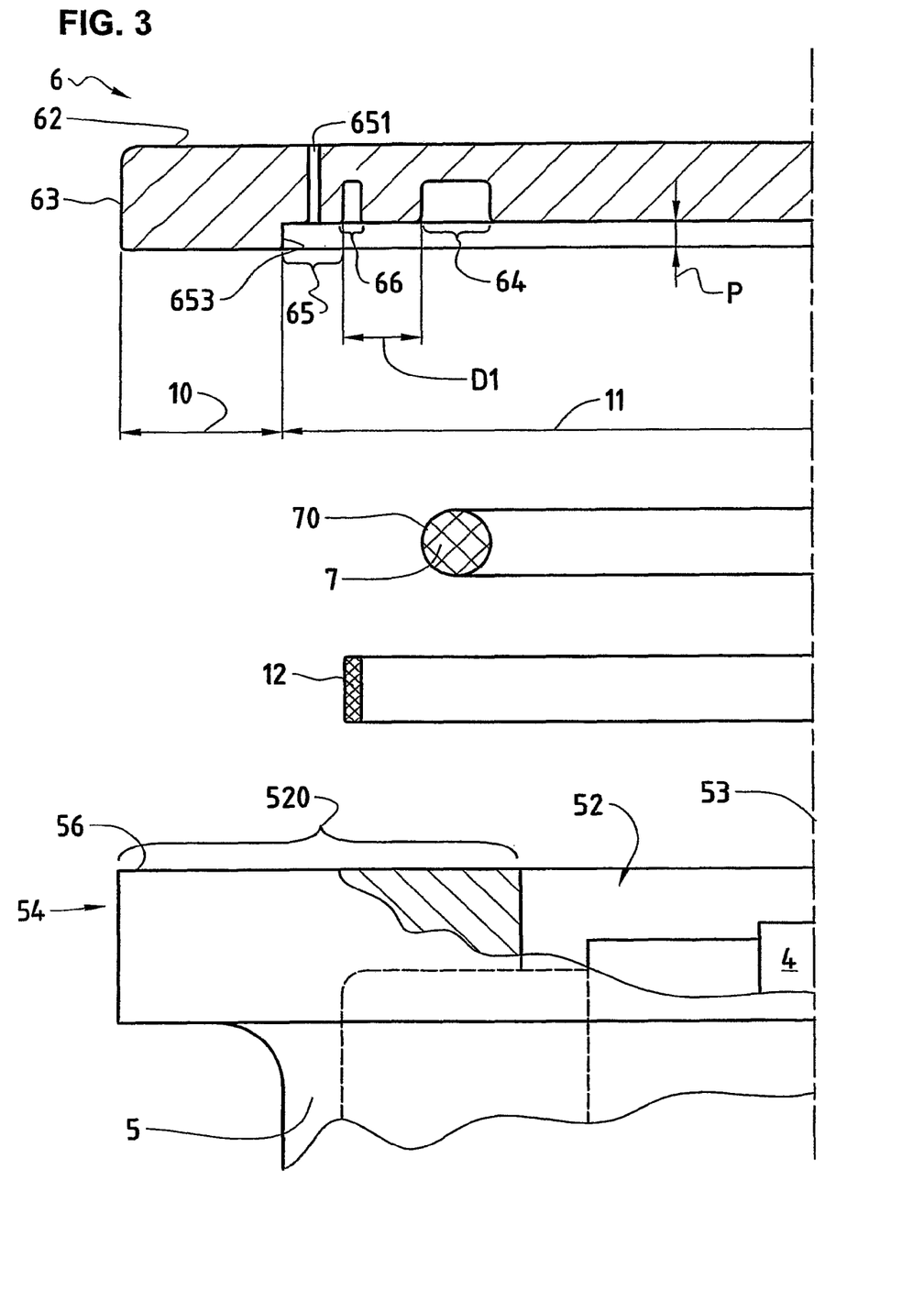
FIG. 3 shows views, partially in section and enlarged in scale, of details of the cover and of the container of the electro-technical device of FIG. 1, before assembly of said cover on said container.
Figure 4:
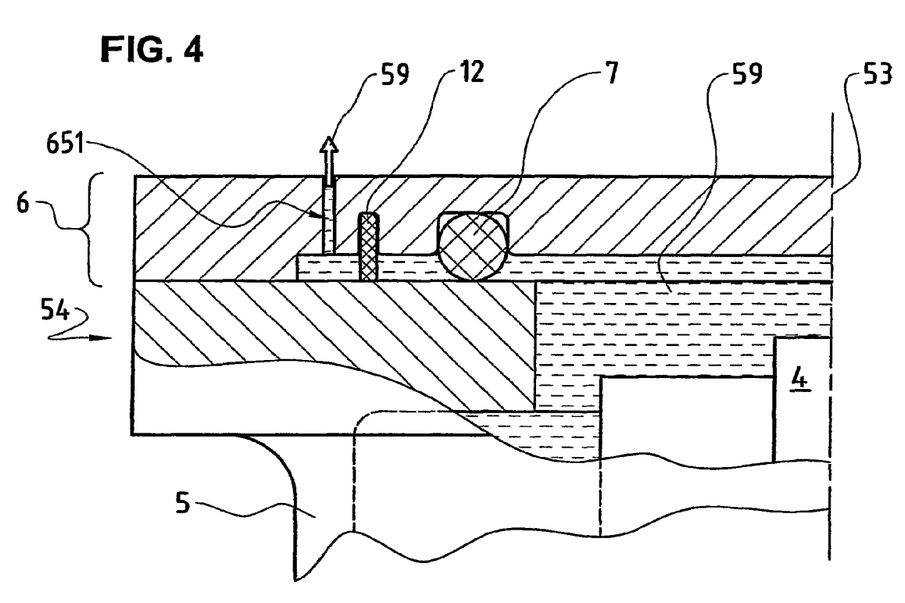
FIG. 4 shows views, partially in section and enlarged in scale, of details of the cover and of the container of the electro-technical device of FIG. 1, during checking of the impermeability of a sealing joint inserted between these two elements.
Figure 5:
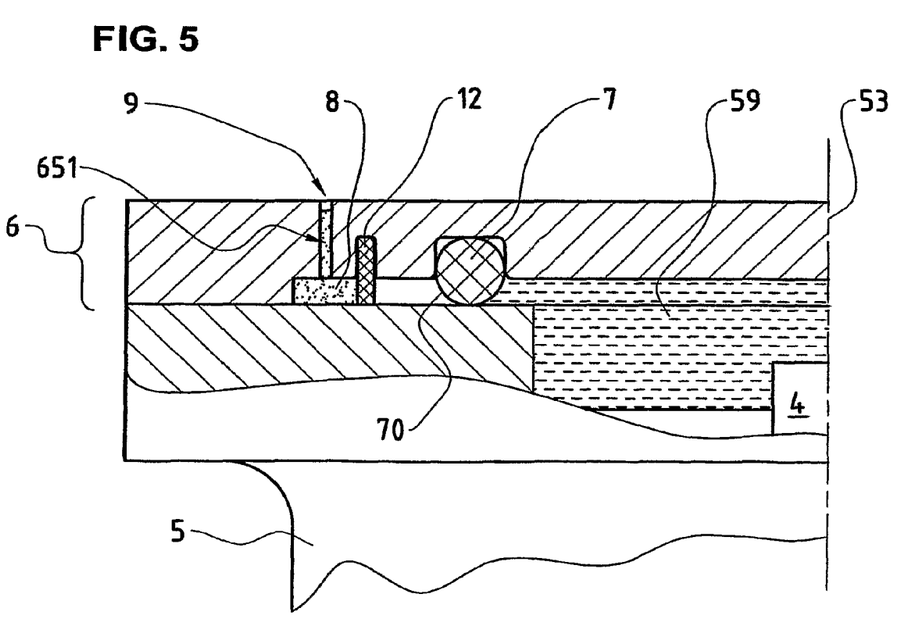
FIG. 5 shows views, partially in section and enlarged in scale, of details of the cover and of the container of the electro-technical device of FIG. 1, after protection of a sealing joint inserted between these two elements.

Referring to the drawing, one sees an electro-technical device 1 comprising, on the one hand, a functional unit 2, made up, for example, of a plurality of capacitors 3 fixed on a common support 4, and, on the other hand, a container 5 in which said functional unit 2 is housed.

The container 5 comprises a wall 50, which (i.e. in a way not limiting for the invention) is of tubular elongated shape and is made in particular of electrically insulating material, and defines at least one chamber 51 and includes at least one access aperture, referred to as aperture 52.

The expression "at least one access aperture" means that it is not excluded that the container 5 has at least one further aperture (not shown).

In the example shown, the container 5 has a longitudinal axis 53 and two opposite ends 54, 55, referred to as first end 54 and second end 55, at the level of each of which there extends an end face 56, 57, referred to as first end face 56 and second end face 57, each of these faces 56, 57 being situated in a plane substantially orthogonal to said longitudinal axis 53.

Likewise in the example shown, the aperture 52 is made in the first end 54 of the container 5, and is of sufficient cross-section to allow axial insertion of the functional unit 2 in the container 5, or even axial extraction of this functional unit 2 from said container 5.

Be that as it may, the container 5 is provided with a cover 6 closing off the aperture 52 in a tight way.

The aperture 52 of the container 5 is bordered by an annular surface 520 formed by a portion of at least one of the faces which are the first and the second end faces 56, 57 of the container 5.

The cover 6 comprises at least two opposite faces which, determining its thickness, are referred to as first face 61 and second face 62, one of these faces, referred to as first face 61, being intended to abut against the annular surface 520 which borders the aperture 52.

In the example shown, the cover 6 likewise comprises a peripheral face, referred to as third face 63.

As has been shown, the first end face of the container 5 thus comprises the aperture 52 and the annular surface 520 which borders it.

Designated by the term annular is a ring shape, without the ring being limited to circular form.

The cover 6 is forcefully pushed in the direction of the annular surface 520, and this, for example, by means of restraining elements 60, such as screws which traverse this cover 6 along its thickness to co-operate with supporting areas provided in the wall of the container 5, said screws being maneuverable from the second face 62 of the cover 6.

As can be seen in the drawing, the tightness between the cover 6 and the container 5 is ensured through interposition of a first sealing joint 7, in particular of toric type, between the annular surface 520, which borders the aperture 52, and the first face 61 of the cover 6.

The first sealing joint 7 is accommodated in a first annular concave supporting area 64 provided in at least one of the elements which are the container 5 and the cover 6.

The expression "first annular concave supporting area" designates a first supporting area in which the first sealing joint 7 can be placed or formed. In the example shown, the first annular concave supporting area 64 is provided only in the cover 6.

The first sealing joint 7 has a lateral surface 70 by which it abuts, at one and the same time, against the cover 6 and against the container 5.

As can also been seen in the drawing, a second sealing joint 8 is likewise inserted between the annular surface 520, which borders the aperture 52, and the first face 61 of the cover 6. This second sealing joint 8 in inserted according to the method of the invention.

Specifically, in a noteworthy way, to insert the second sealing joint 8 between the annular surface 520, which borders the aperture 52, and the first face 61 of the cover 6:

during a first operation, in at least one of the elements which are the container 5 and the cover 6, a second annular concave supporting area 65 is formed, which second annular concave supporting area 65 surrounds the first annular concave supporting area 64 by extending a first predetermined distance D1 from said first annular concave supporting area 64, has a closed concavity, i.e. is not directly accessible from the exterior of the electro-technical device 1, during a second operation, after having applied the cover 6 against the annular surface 520, which borders on the aperture 52, the second sealing joint 8 is formed by moulding a sealing substance 81 in the second annular concave supporting area 65 in such a way that this sealing substance 81 presses at one and the same time against the cover 6 and against the container 5.

In the example shown, the second annular concave supporting area 65 is provided only in the cover 6.

In a noteworthy way, the moulding is achieved in at least one of the ways which are:

moulding by injection of a sealing substance 81 in the second annular concave supporting area 65 after mounting the cover 6 on the container 5, and moulding by expansion of a sealing substance 81 placed in the second annular concave supporting area 65, prior to mounting of the cover 6 on the container 5.

To achieve the moulding by injection of the sealing substance 81:

in at least one of the elements which are the cover 6 and the container 5, a first channel 651 is made which connects the second annular concave supporting area 65 to a first external point of injection 9 of the sealing substance 81, a sealing substance 81 is provided having a fluidity sufficient to allow its injection through a passage of the type of the first channel 651, and from the first external injection point 9, said sealing substance 81 is injected through said first channel 651 so as to fill the second annular concave supporting area 65 and press in a tight way at one and the same time against the cover 6 and against the container 5.

The first channel 651 consists, for example, of a perforation.

This solution of moulding by injection constitutes a preferred solution for achieving the second sealing joint 8.

In a known way, one skilled in the art is able to select the sealing substance 81. This sealing substance 81 could be, for instance, a silicon paste.

The injection is carried out by means of an injection device 82 connected beforehand in a tight way to the first channel 651.

This injection device 82 can be of any known type; for example it could consist of a syringe or a more complex device implementing an injection pump actuated by a motor element.

In a way also noteworthy, at least prior to the step of injection, at least one second channel 652 is made in at least one of the elements which are the cover 6 and the container 5, which channel connects the second annular concave supporting area 65 to an outer surface of the electro-technical device 1 which is exposed to the atmosphere so as to form a vent allowing evacuation of a first fluid 58 of gaseous type, such as air, retained in the second annular concave supporting area 65, this evacuation being initiated, in particular, upon injection of the sealing substance 81 in the second annular concave supporting area 65.

The second channel 652 consists, for example, of a perforation.

This collection of technical features makes it possible to ensure that the filling of the second annular concave supporting area 65 with the sealing substance 81 is carried out optimally.

Be it as it may, achieving the second sealing joint 8 according to the aforementioned technique makes it possible to occlude in a tight way any interstice (not shown) remaining between the annular surface 520, which borders the aperture 52, and the first face 61 of the cover 6.

In this way, in the case of failure of the first sealing joint 7, the escape of a second fluid 59, of liquid type, contained in the container 5 can be prevented.

Likewise, the introduction of a third fluid (not shown), such as surface water, from the exterior of the container 5 can likewise be prevented.

The fact that the second sealing joint 8 is made by moulding makes it possible to form an especially efficient obstacle to the development of corrosion between the cover 6 and the container 5 and to the spread of this corrosion towards the interior of said container 5.

To form the second annular concave supporting area 65, a cavity 65 is made in at least one of the elements which are the container 5 and the cover 6.

More specifically, to form the second annular concave supporting area 65:
- at the level of at least one of the parts which are, on the one hand, the annular surface 520 which borders on the aperture 52, and, on the other hand, the first face 61 of the cover 6, two zones are defined which are
  - a first peripheral zone 10 of annular shape whose width corresponds to a portion of the width of the annular surface 520 bordering on the aperture 52, said peripheral zone 10 being intended to determine a zone of contact between the cover 6 and the container 5, and
  - a second central zone 11, surrounded by said peripheral zone 10 then
- in the central zone 11, a cavity 65 is made of predetermined depth P, and which, at least when the cover 6 is mounted on the container 5, is laterally delimited, on the one hand, by a lateral face 653, which is contiguous to the peripheral zone, and, on the other hand, by a portion of the lateral surface 70 of the first sealing joint 7.

In a preferred embodiment, at least one of the channels which are the first channel 651 and the second channel 652 is provided along the thickness of the cover 6, i.e. this channel connects the second cavity to the second face 62 of the cover 6.

In a noteworthy way, before the second sealing joint 8 is formed, the impermeability of the first sealing joint 7 is checked through application of pressure of at least one second fluid 59, of liquid type, against a portion of the lateral face 70 of said first sealing joint 7, this pressure being generated at least from the interior of the container 5.

According to a first solution, to check the impermeability of the first sealing joint 7, in the case where the container 5 contains a second fluid 59, of liquid type, this fluid is expanded by increasing its temperature, in particular up to a predetermined temperature value, referred to as the trial temperature, and detected and monitored is the presence of this second fluid 59, of liquid type, between the first sealing joint 7 and the second annular concave supporting area 65.

To detect the presence of this second fluid 59, of liquid type, between the first sealing joint 7 and the second annular concave supporting area 65, monitored is the exit of this second fluid 59, of liquid type, at least through the first channel 651.

Detection of the second fluid 59, of liquid type, thus indicates failure of the tightness of the second sealing joint 7.

For example, detection of leakage of the second fluid 59, of liquid type, is made visually when the trial temperature is attained or after cooling of the electro-technical device.

To increase the temperature of the second fluid 59, of liquid type, the electro-technical device is placed in a heating device (not shown). The heating device has not been shown, but it may consist, for instance, of an oven.

As concerns the value of the trial temperature, it can be at least equal to a temperature value which the second fluid 59, of liquid type, which is contained in the electro-technical device 1, is at when this electro-technical device is operating.

The value of the trial temperature can also be at least equal to a temperature value reached by the second fluid owing to the exterior environment of the electro-technical device, for example when it is exposed to solar radiation.

In a way also noteworthy, prior to at least one of the steps which are
- the step of injection of the sealing substance 81 used to form the second sealing joint 8, and
- the step of checking the impermeability of the first sealing joint 7:
- in at least one of the elements which are the container 5 and the cover 6:
- a third annular concave supporting area 66 is formed which surrounds the first annular concave supporting area 64, i.e. which is situated between the first annular concave supporting area 64 and the second annular concave supporting area 65,
- in this third annular concave supporting area, at least one element 12 is placed, referred to as a barrier element 12, which
- abuts at one and the same time against the cover 6 and against the container 5,
- is permeable with respect to the second fluid 59, of liquid type, contained in the container 5,
- is impermeable with respect to the sealing substance 81 making up the second sealing joint 8.

These technical features make it possible:
- during the step of checking the impermeability, to enable the second fluid 59, of liquid type, to be drained off when it crosses the first sealing joint 7 owing to failure of the impermeability of the latter, but
- during the step of injection of the sealing substance, which allows the second sealing joint 8 to be formed, to prevent the migration of said sealing substance 81 toward the first sealing joint 7.

To achieve this, the properties of the first sealing joint 7 must not be altered through contact with the sealing substance 81 used to form the second sealing joint 8, but rather the detection according to the aforementioned method of a leakage of the second fluid can be ensured because said second fluid, which crosses the first sealing joint 7, can drain off in the second annular concave supporting area 65, then at least through the first channel 651, or even through the second channel 652.

During the first operation of the method, which consists in forming, in at least one of the elements which are the container 5 and the cover 6, a second annular concave supporting area 65, this second annular concave supporting area 65 surrounding the first annular concave supporting area 64 by extending a first predetermined distance D1 from said first annular concave supporting area 64, a distance D1 is thus to be provided which is sufficient for the third annular concave supporting area 66 to be able to be achieved.

In other words, the distance D1 which separates the second annular concave supporting area 65 from the first annular concave supporting area 64 is at least sufficient for the third annular supporting area 66.

Another noteworthy way to check the impermeability of the first sealing joint 7 consists in, at least after having applied the cover 6 on the container 5 with interposition of the first sealing joint 7:

connecting at least the first channel 651 to a source of a third fluid, of gaseous type, this third fluid being of noteworthy nature in particular owing to its absence in the first fluid 58, of gaseous type, such as atmospheric air contained in the electro-technical device 1 when the cover 5 has been put in place, this connecting having the function of filling up the second cavity 65 with this third fluid and of putting this third fluid into contact with the first sealing joint 7, making a fourth channel in at least one of the elements which are the container 5 and the cover 6, drawing out the first fluid 58 contained in the electro-technical device 1 by making use of the fourth channel, and searching for the presence in the first fluid 58, drawn out of the electro-technical device 1, of the third fluid so as to reveal the crossing of the first joint 7 by this third fluid and the lack of tightness of said first joint 7, occluding in a tight way the fourth channel when the step of checking of the impermeability of the first sealing joint 7 has been carried out and when the presence of the third fluid has not been detected.

By way of example, the third fluid, of gaseous type, is helium.

Preferably, to search for the presence in the first fluid 58, drawn out of the electro-technical device 1, of the third fluid so as to reveal the crossing of the first joint 7 by this third fluid and the failure of said first joint 7 with respect to impermeability, a mass spectrograph is used.

As has been mentioned, the invention also concerns the electro-technical device 1 comprising a cover 6 provided with a first sealing joint 7 checked and secured according to the method of the invention.

Specifically, the electro-technical device 1 is noteworthy in that:

at least one of the elements, which are the container 5 and the cover 6, comprises a second annular concave supporting area 65, which second annular concave supporting area 65 surrounds the first annular concave supporting area 64 by extending to a predetermined distance D1 from said first annular concave supporting area 64, has a closed concavity, i.e. is not directly accessible from the exterior of the electro-technical device 1, the second sealing joint 8 is made up by moulding of a sealing substance 81 in the second annular concave supporting area 65 in such a way that this sealing substance 81 presses at one and the same time against the cover 6 and against the container 5.

Likewise, the electro-technical device 1 is noteworthy in that at least one of the elements which are the cover 6 and the container 5 comprises at least one first channel 651 which connects the second annular concave supporting area 65 to a first external point of injection 9 of the sealing substance 81.

The electro-technical device 1 is also noteworthy in that at least one of the elements which are the cover 6 and the container 5 comprises at least one second channel 652 which connects the second annular concave supporting area 65 to an outer surface of the electro-technical device 1 which is exposed to the atmosphere so as to form a vent allowing evacuation of a first fluid 58 of gaseous type, such as air, retained in the second annular concave supporting area 65, this evacuation being initiated, in particular, during injection of the sealing substance 81 in the second annular concave supporting area 65.

The electro-technical device 1 is noteworthy moreover in that the second annular concave bearing area 65 consists of a cavity 65 made in at least one of the elements which are the container 5 and the cover 6.

More specifically, the electro-technical device 1 is furthermore noteworthy in that the second annular concave bearing area 65 consists of a cavity 65 of predetermined depth P which, at least when the cover 6 is mounted on the container 5, is laterally delimited, on the one hand, by a portion of the lateral surface 70 of the first sealing joint 7, and, on the other hand, by a lateral face 653 which is contiguous to a first peripheral zone 10 of annular shape whose width corresponds to a portion of the width of the annular surface 520 bordering on the aperture 52, said peripheral zone 10 being intended to determine a zone of contact between the cover 6 and the container 5.

The electro-technical device 1 is also noteworthy in that at least one of the elements which are the container 5 and the cover 6:

comprise a third annular concave supporting area 66 which surrounds the first annular concave supporting area 64, i.e. which is situated between the first annular concave supporting area 64 and the second annular concave supporting area 65, and found disposed in this third annular concave supporting area 65 is at least one element 12, referred to as a barrier element 12, which abuts at one and the same time against the cover 6 and against the container 5, is permeable with respect to the second fluid 59, of liquid type, contained in the container 5, is impermeable with respect to the sealing substance 81 making up the second sealing joint 8.

In a notable manner, the electro-technical device 1 is made up of a high voltage capacitor device, this electro-technical device comprising a functional unit 2, made up of at least one capacitor unit 3.

High voltage capacitors such as voltage capacitor dividers are used in High Voltage applications (rated voltage level >10 kV) like coupling capacitors (Phase to ground), grading capacitors (for example on switchgears), voltage measurement or all other domains which require capacitive energy.

The container 5 comprises at least one aperture 52 provided with a cover 6.

This electro-technical device 1 is furthermore noteworthy in that:
  the cover 6 is sealed within the housing by a first seal 7 and a second seal 8,
  the first seal 7 being inserted between the container 5 and the cover 6 and held against the container 5 by the cover 6, and
  the second seal 8 being inserted between the container 5 and the cover 6 after the first seal 7 is held against the container 5 by the cover 6.

Finally, the electro-technical device 1 comprises a cover 6 which,
  is forcefully moved in the direction of the annular surface 520, by means of restraining elements 60,
  this electro-technical device 1 includes a second sealing joint 8 inserted between the annular surface 520, which borders on the aperture 52, and the first face 61 of the cover 6.

In a notable manner:
  at least one of the elements, which are the container 5 and the cover (6), comprises a second annular concave supporting area 65, which second annular concave supporting area 65
    surrounds the first annular concave supporting area 64 by extending to a predetermined distance D1 from said first annular concave supporting area 64
    has a closed concavity, i.e. is not directly accessible from the exterior of the electro-technical device 1,
  the second sealing joint 8 is made up by moulding of a sealing substance 81 in the second annular concave supporting area 65 in such a way that this sealing substance 81 presses at one and the same time against the cover 6 and against the container 5.

Preferably, the second seal 8 is inserted as semi-solid sealing substance or a liquid sealing substance 81.

Preferably, the second seal 8 forms a semi-solid seal or a solid seal after it is inserted.

The invention claimed is:

1. A method for securing a first sealing joint used on an electro-technical device, this electro-technical device comprising a functional unit and a container housing said functional unit,
  said container including at least one aperture provided with a cover which cover has at least one first face intended to abut an annular surface which borders on the aperture, and this through the agency of a first sealing joint accommodated in a first annular concave supporting area provided in at least one of the elements which are the container and the cover, is forcefully pushed in the direction of the annular surface, by means of restraining elements,
  this electro-technical device comprising a second sealing joint inserted between the annular surface which borders on the aperture and the first face of the cover:
  this method being characterised in that to insert the second sealing joint between the first annular surface which borders on the aperture and the first face of the cover:
    during a first operation, in at least one of the elements which are the container and the cover, a second annular concave supporting area is formed, which second annular concave supporting area surrounds the first annular concave supporting area by extending a first predetermined distance from said first annular concave supporting area, has a closed concavity not directly accessible from the exterior of the electro-technical device,
    during a second operation, after having applied the cover against the annular surface which borders on the aperture the second sealing joint is formed by moulding a sealing substance in the second annular concave supporting area in such a way that this sealing substance presses at one and the same time against the cover and against the container,
  characterised in that before forming the second sealing joint, the impermeability of the first sealing joint is checked through application of pressure of at least one second fluid of liquid type against a portion of the lateral face of said first sealing joint, this pressure being generated at least from the inside of the container.

2. The method according to claim 1, characterised in that to check the impermeability of the first sealing joint, in the case where the container contains a second fluid, of liquid type, this fluid is expanded by increasing its temperature, in particular up to a predetermined temperature value, referred to as the test temperature, and detected and monitored is the presence of this second fluid, of liquid type, between the first sealing joint and the second annular concave supporting area.

3. The method according to claim 2, characterised in that, to detect the presence of this second fluid, of liquid type, between the first sealing joint and the second annular concave supporting area, monitored is the exit of this second fluid, of liquid type, at least through the first channel.

4. The method according to claim 1, characterised in that, to check the impermeability of the first sealing joint, the method consists in, at least after having applied the cover on the container with interposition of the first sealing joint, the steps of:
  connecting at least the first channel to a source of a third fluid, of gaseous type, this third fluid being of noteworthy nature in particular owing to its absence in the first fluid, of gaseous type, contained in the electro-technical device when the cover has been put in place, this connecting step having the function of filling up the second cavity with this third fluid and of putting this third fluid into contact with the first sealing joint,
  making a fourth channel in at least one of the elements which are the container and the cover,
  drawing out the first fluid contained in the electro-technical device by making use of the fourth channel, and
  searching for the presence in the first fluid, drawn out of the electro-technical device, of the third fluid so as to reveal the crossing of the first joint by this third fluid and the lack of tightness of said first joint,
  occluding in a tight way the fourth channel when the step of checking of the impermeability of the first sealing joint has been carried out and when the presence of the third fluid has not been detected.

5. The method according to claim 1, characterised in that prior to at least one of the steps which are the step of injection of the sealing substance used to form the second sealing joint, and the step of checking the impermeability of the first sealing joint: in at least one of the elements which are the container and the cover: a third annular concave supporting area is formed which surrounds the first annular concave supporting area, and is situated between the first annular concave supporting area and the second annular concave supporting area, in this third annular concave supporting area, at least one element is placed, referred to as a barrier element, which abuts at one and the same time against the cover and against the container, is permeable with respect to the second fluid, of liquid type, contained in the container, is impermeable with respect to the sealing substance making up the second sealing joint.

6. An electro-technical device comprising a functional unit and a container housing said functional unit, said container comprising at least one aperture provided with a cover which is forcefully moved in the direction of an annular surface, by means of restraining elements,     this electro-technical device includes a second sealing joint inserted between the annular surface, which borders on the aperture, and a first face of the cover     this device being characterised in that:

at least one of the elements, which are the container and the cover, comprises a second annular concave supporting area, which second annular concave supporting area surrounds a first annular concave supporting area by extending to a predetermined distance from said first annular concave supporting area has a closed concavity not directly accessible from the exterior of the electro-technical device,     the second sealing joint is made up by moulding of a sealing substance in the second annular concave supporting area in such a way that this sealing substance presses at one and the same time against the cover and against the container, characterised in that at least one of the elements which are the container and the cover: comprise a third annular concave supporting area which surrounds the first annular concave supporting area, which is situated between the first annular concave supporting area and the second annular concave supporting area, and found disposed in this third annular concave supporting area is at least one element, referred to as a barrier element, which abuts at one and the same time against the cover and against the container, is permeable with respect to the second fluid, of liquid type, contained in the container, is impermeable with respect to the sealing substance making up the second sealing joint.

* * * * *

UNITED STATES PATENT AND TRADEMARK OFFICE
CERTIFICATE OF CORRECTION

PATENT NO. : 7,576,972 B2 Page 1 of 1
APPLICATION NO. : 11/547455
DATED : August 18, 2009
INVENTOR(S) : Savary et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 316 days.

Signed and Sealed this

Seventh Day of September, 2010

David J. Kappos
*Director of the United States Patent and Trademark Office*